(12) United States Patent
Lin et al.

(10) Patent No.: US 6,461,979 B1
(45) Date of Patent: Oct. 8, 2002

(54) LPCVD FURNACE UNIFORMITY IMPROVEMENT BY TEMPERATURE RAMP DOWN DEPOSITION SYSTEM

(75) Inventors: Chih-Hao Lin, Banchiou; Bu-Fang Chen, Taipei; Xi-Sheng Zhuang, Hsinchu; Song-Fu Chen, Nantou, all of (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 10/075,841

(22) Filed: Feb. 13, 2002

(51) Int. Cl.[7] .................. H01L 21/31; H01L 21/469
(52) U.S. Cl. ............ 438/763; 438/680; 438/758; 438/761; 427/248.1; 427/585
(58) Field of Search ..................... 438/763, 680, 438/681, 758, 761; 427/248.1, 585

(56) References Cited

U.S. PATENT DOCUMENTS

| | | | |
|---|---|---|---|
| 4,395,438 A | 7/1983 | Chiang | 427/94 |
| 4,851,370 A | 7/1989 | Doklan et al. | 437/225 |
| 4,888,142 A | 12/1989 | Hayashi et al. | 264/65 |
| 4,992,044 A | 2/1991 | Philipossian | 432/253 |
| 5,953,634 A * | 9/1999 | Kajita et al. | 438/687 |
| 5,976,990 A | 11/1999 | Mercaldi et al. | 438/762 |
| 6,017,351 A * | 6/2000 | Venkatasubramanian | 118/725 |
| 6,117,755 A * | 9/2000 | Kun-Yu et al. | 438/592 |
| 6,350,648 B1 * | 2/2002 | Ping et al. | 438/255 |

* cited by examiner

Primary Examiner—Alexander Ghyka
(74) Attorney, Agent, or Firm—George O. Saile; Stephen B. Ackerman

(57) ABSTRACT

A new method is provided for the application of Chemical Vapor Deposition (CVD) processes. Where conventional CVD processes are performed while maintaining one, constant temperature during the CVD process, from the start of the CVD process up to the point where the CVD process is completed, the invention provides for first raising the temperature to a processing temperature and then gradually reducing the applied temperature within the cycle time that is required for the completion of the CVD process.

9 Claims, 3 Drawing Sheets

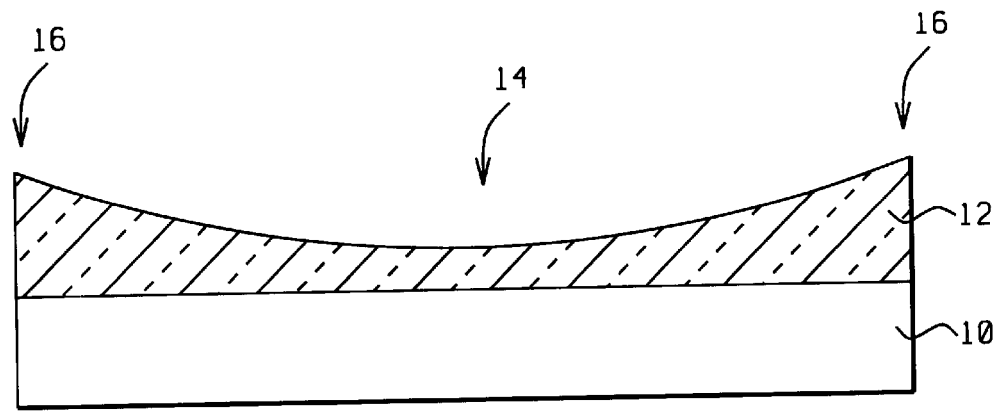
FIG. 1 - Prior Art
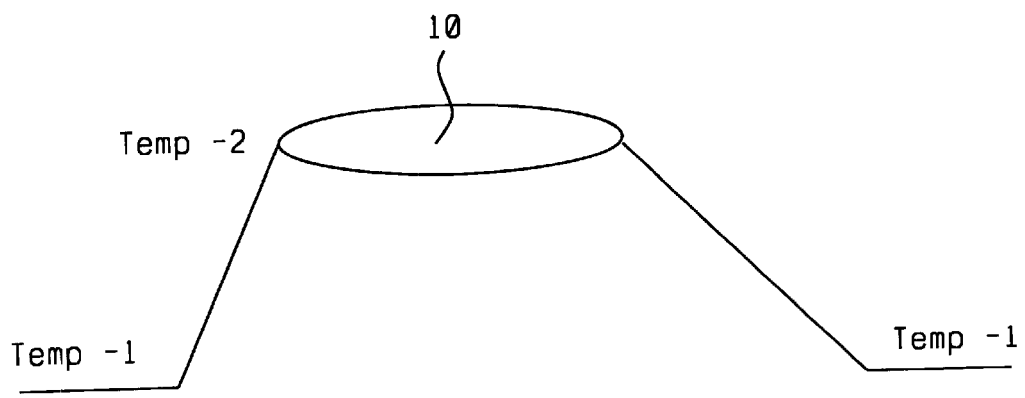
FIG. 2 - Prior Art

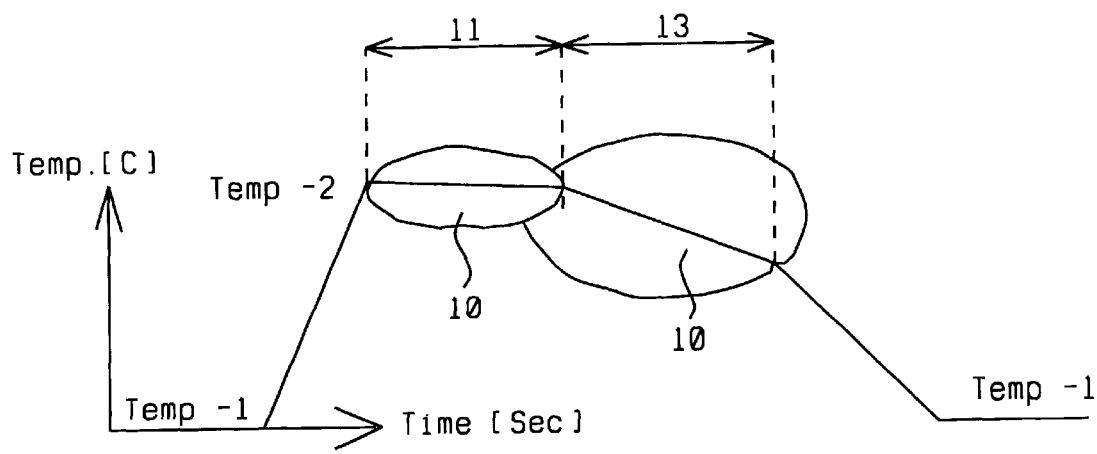
FIG. 3
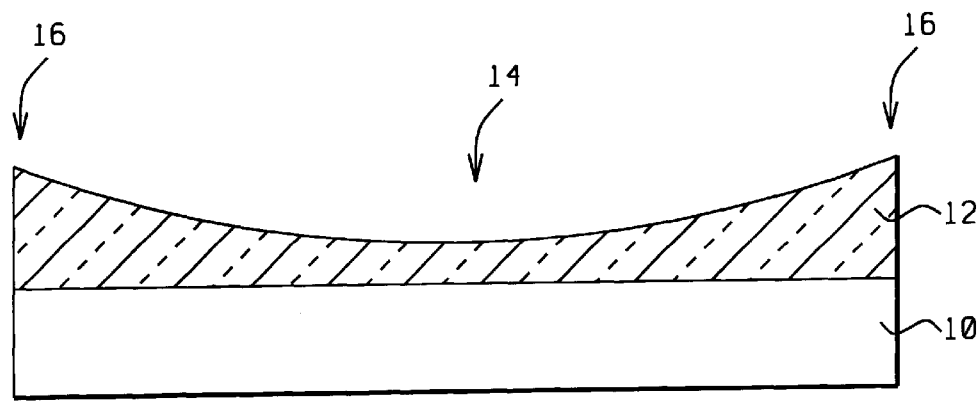
FIG. 4a – Prior Art
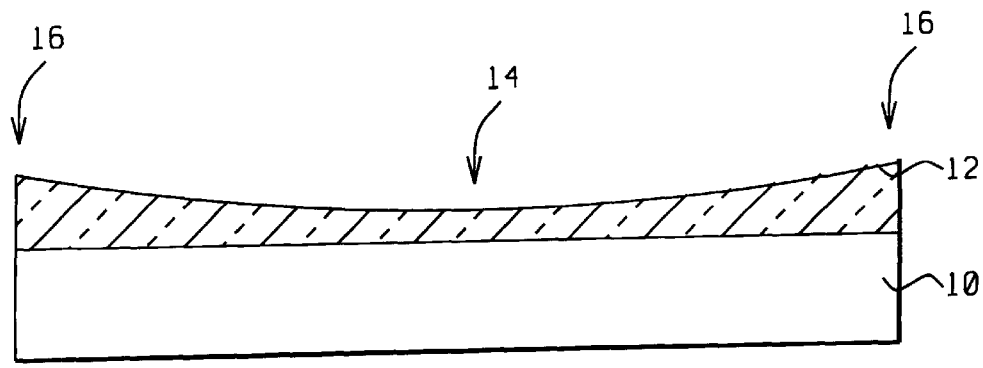
FIG. 4b

| | U | C | L |
|---|---|---|---|
| Invention | 1.63% | 1.39% | 2.02% |
| Conventional | 2.23% | 1.84% | 2.62% |

LPCVD FURNACE UNIFORMITY IMPROVEMENT BY TEMPERATURE RAMP DOWN DEPOSITION SYSTEM

BACKGROUND OF THE INVENTION (1) Field of the Invention

The invention relates to the fabrication of integrated circuit devices, and more particularly, to a method for the enhancement of Low Pressure Chemical Vapor Deposition (LPCVD).

(2) Description of the related Prior Art

The process of Chemical Vapor Deposition (CVD) is widely applied and well known in the art of creating semiconductor devices and it explained in detail in for instance the text Silicon Processing for the VLSI Era, Volume 1, by Stanley Wolf and Rickard N. Tauber, published by the Lattice Press. From this source the process and its salient features are briefly highlighted.

The CVD process can be summarized as consisting of the following sequence of steps:

a given composition and flow rate of reactant gasses and diluent inert gasses is introduced into a reaction chamber the gas species move to the substrate the reactants are absorbed on the substrate the adatoms undergo migration and film-forming chemical reactions, and the gaseous by-products of the reaction are de-sorbed and removed from the reaction chamber.

Energy to drive the reactions can be supplied by several methods such as thermal, photons or electrons, with thermal energy being the most frequently form of energy.

In practice, the chemical reactions of the reactant gasses leading to the formation of a solid material may take place not only on or very close to the surface of the wafers a so-called heterogeneous reaction, but can also take place in the gas phase, a so-called homogeneous reaction. Heterogeneous reactions are much more desirable since such reactions occur selectively only on heated surfaces and are known to produce good quality films of semiconductor material. Homogeneous reactions in the other hand are undesirable since these reactions form gas phase clusters of the depositing material, which can result in poorly adhering, low density films or in defects in the depositing film. In addition, such reactions also consume reactants and can cause a decrease in deposition rates. Thus, one important characteristic of a CVD process is the degree to which heterogeneous reactions are favored over gas phase reactions.

One of the key aspects and concerns of applying CVD processes is the uniformity with which the semiconductor material is deposited over the surface of a wafer, a concern that is further emphasized by the increased size of semiconductor wafers that are being used for the creation of semiconductor devices. A value of concentration gradient can be used in this respect, which is indicative of the amount of semiconductor material that is deposited over a unit of surface. Because of the impact of the concentration gradient, it has been found that the semiconductor material is deposited thinner in the center of the wafer than the average of the deposition thickness over the complete surface of the wafer. For the same reason, it has been found that the deposited material is thicker around the perimeter of the wafer than the average of the deposition thickness over the surface of the wafer. The variation of the concentration gradient of the deposition across the surface of a wafer leads to poor uniformity of the deposited material across the surface of the substrate.

Extreme uniformity of the deposited material over a semiconductor surface is required in order to achieve uniformity of the devices that are created using the entire surface of the wafer. With increased wafer size, this uniformity is more difficult to achieve and to maintain. The invention provides a method that addresses this concern.

U.S. Pat. No. 4,992,044 (Pillipossian) shows an LPCVD furnace with improved within wafer uniformity.

U.S. Pat. No. 5,976,990 (Mercaldi et al.) discloses a LPCVD SiN process.

U.S. Pat. No. 4,851,370 (Doklan et al.) shows a LPCVD SiN process.

U.S. Pat. No. 4,888,142 (Hayashi) and U.S. Pat. No. 4,395,438 (Chiang) are related patents.

SUMMARY OF THE INVENTION

A principle objective of the invention is to provide a method for enhanced uniformity of deposited layers over a semiconductor surface.

It is another objective of the invention to eliminate a temperature variation or gradient between the center of the substrate and the perimeter of the substrate during the process of CVD.

It is yet another objective of the invention to offset the conventional difference in temperature between the center of the substrate and the perimeter of the substrate during CVD processing, where conventionally the edge of the temperature will be elevated to a lower temperature than the center of the substrate.

It is a further objective of the invention to eliminate the effect that the temperature gradient has on the deposition rate of CVD deposited semiconductor material, by reducing the deposition rate of the semiconductor material when proceeding toward the perimeter of the substrate.

In accordance with the objectives of the invention a new method is provided for the application of Chemical Vapor Deposition (CVD) processes. Where conventional CVD processes are performed while maintaining one, constant temperature during the CVD process, from the start of the CVD process up to the point where the CVD process is completed, the invention provides for first raising the temperature to a processing temperature and then gradually reducing the applied temperature within the cycle time that is required for the completion of the CVD process.

BRIEF DESCRIPTION OF THE DRAWINGS

FIG. 1 shows the cross section of the surface of a substrate over the surface of which conventionally is deposited a layer of semiconductor material using CVD processing.

FIG. 2 shows a temperature profile that is in force during conventionally CVD processing.

FIG. 3 shows a temperature profile of the invention that is in force during CVD processing.

FIGS. 4a and 4b show comparative cross sections of the surface of a substrate over the surface of which, FIG. 4a, conventionally is deposited a layer of semiconductor material using CVD processing and, FIG. 4b, over which is deposited a layer of semiconductor material using CVD processing in accordance with the invention.

DESCRIPTION OF THE PREFERRED EMBODIMENTS

Figures 5A, 5B:
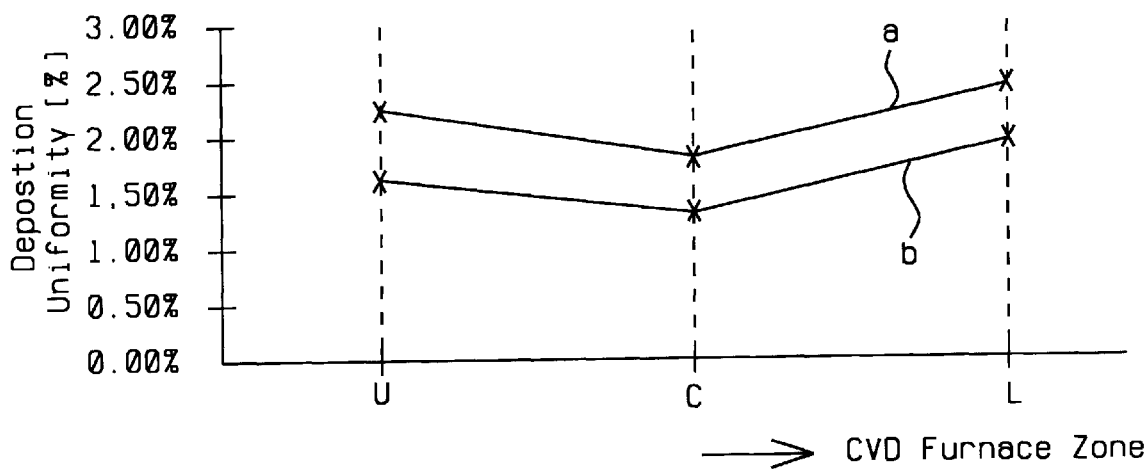
FIGS. 5a and 5b show experimental results in support of the invention.

The invention will now be described in detail using FIGS. 3, FIG. 4b and FIGS. 5a and 5b. Prior art methods have been highlighted in FIGS. 1, 2 and 4a.

Referring first specifically to FIG. 1, there is shown a cross section of a silicon substrate 10 over the surface of which a layer 12 of semiconductor material has been deposited. From the cross section that is shown in FIG. 1 it is clear that the surface of the deposited layer 12 shows a significant degree of dishing. That is the deposited layer 12 of semiconductor material is considerably thinner in the center 14 of the substrate 10 than around the perimeter 16 of the substrate 10.

As a material used for the creation of layer 12 can be considered any of the conventionally CVD deposited materials that are typically applied for the creation of semiconductor devices, such as silicon nitride, tetra-ethyl-orthosilicate (TEOS), doped or undoped polysilicon, High Temperature Oxide (HTO) and the like.

The invention specifically addresses the deposition of a layer of silicon nitride, deposited using methods of CVD. As an example of such a deposition of a layer of silicon nitride can be cited depositing a layer of silicon nitride using LPCVD or PECVD procedures, at a temperature between about 200 and 800 degrees C., to a thickness between about 200 and 5,000 Angstrom.

The deposition rate or the previously introduced concentration gradient in the center of the substrate 10 is considerably lower in the center 14 of the substrate than the deposition rate or concentration gradient of the deposited layer 12 around the perimeter 16 of the substrate 10. This difference in deposition rate prevents the creation of a layer of semiconductor material of good uniformity over the surface of substrate 10, preventing uniform and identical creation of semiconductor devices over the surface of the substrate.

Conventional methods that are used for the CVD deposition of layer 12, FIG. 1, use a constant temperature, which is the temperature that is for various reasons considered the optimum temperature for the deposition of layer 12. This is highlighted in FIG. 2, which shows a first temperature Temp-1, which is typically an environmental temperature, and a second temperature Temp-2. The Temp-2 is the temperature to which the substrate is raised during the time of CVD deposition of a layer of semiconductor material. It must be noted that Temp-2 remains in force during the CVD deposition of a layer of semiconductor material over the surface of a substrate, this value remains in force until the process of CVD has been completed after which the elevated temperature is allowed to return to Temp-1.

FIG. 3 is a pictorial representation of the process of the invention, whereby the temperature of the substrate is, during the process of CVD, no longer held at one constant value but is varied. The objective of the temperature variation of the invention is to:

1. eliminate a temperature variation or gradient between the center of the substrate and the perimeter of the substrate
2. to offset the conventional difference in temperature between the center of the substrate and the perimeter of the substrate, where conventionally the edge of the temperature will be elevated to a lower temperature than the center of the substrate, and
3. eliminate the effect that the temperature gradient has on the deposition rate of the deposited semiconductor material by reducing the deposition rate of the semiconductor material when proceeding toward the perimeter of the substrate.

The depiction that is shown in FIG. 3 conveys the highlighted principles by showing a temperature curve that first is raised from a value of Temp-1 to a value of Temp-2, after which the temperature is maintained at a constant value of Temp-2 for a period 11 of time.

The time during which the CVD process is performed is plotted along the horizontal or X-axis, the temperature of the wafer over the surface of which the CVD process is applied is plotted-along the vertical or Y-axis.

After the time 11 has expired, the temperature is gradually reduced, time period 13, to the point where the CVD process is completed. At that point the temperature is allowed to return to the value Temp-1.

The improvement that can be obtained using the principles that have been highlighted in FIG. 3 are shown in the cross sections of FIGS. 4a and 4b. FIG. 4a represents the conventional method of performing a CVD process while the cross section of FIG. 4b represents a CVD process in accordance with the invention. In comparing the two cross sections that are shown in FIGS. 4a and 4b it is clear that the deposited layer 18 of FIG. 4a has a considerable amount of dishing, which is much more pronounced than the amount of dishing that is observed in the cross section of FIG. 4b. This difference in the amount of dishing between FIG. 4a and FIG. 4b is representative of the improvement that is obtained by the invention by controlling the temperature gradient over the surface of the substrate.

The concept of the invention has further been experimentally verified by creating a layer of silicon nitride ($Si_3Ni_4$) over the surface of a substrate applying two deposition sequences, the first sequence being a conventional method without temperature ramp-down, the second being the sequence of the invention by using temperature ramp-down during the CVD process. The thickness of the deposited layer of $Si_3Ni_4$ was 1,625 Angstrom, deposited at a temperature of 780 degrees C. using a standard CVD deposition furnace and procedure.

For the standard or conventional CVD, the time of deposition was set at 1 hour and 38 minutes.

For the CVD of the invention, the processing temperature of 780 degrees C. was maintained for 1 hour and 12 minutes after which the temperature of the substrate was ramped-down from 780 degrees C. to 720 degrees C. over an elapsed time-span of 30, that is at a ramp-down rate of 2 degrees C./min.

For this experiment, seven wafers were used mounted within a tube comprising seven wafer positions, the wafers being referred to with a sequential wafer number of #1 through #7. The below indicated value of Std is the measured difference of the thickness of the deposited layer of $Si_3Ni_4$ between the perimeter of the substrate and the center of the substrate. For instance, a value of Std=20.38 indicates that the layer of $Si_3Ni_4$ was deposited at the perimeter of the substrate with a thickness that exceeded the thickness of the deposited layer of $Si_3Ni_4$ in the center of the substrate by 20.38 Angstrom. The first two rows of the below listed table represent the standard CVD process, the second two rows represent the process of the invention in which temperature ramp-down is used, as indicated above.

| Wafer | | #1 | #2 | #3 | #4 | #5 | #6 | #7 |
|---|---|---|---|---|---|---|---|---|
| Standard CVD | Thickness | 1614 | 1616 | 1619 | 1621 | 1626 | 1641 | 1594 |
| | Std | 20.38 | 18.45 | 15.40 | 15.63 | 15.60 | 16.06 | 25.41 |
| Ramp-down CVD | Thickness | 1621 | 1609 | 1610 | 1618 | 1646 | 1675 | 1624 |
| | Std | 14.13 | 14.15 | 12.87 | 13.46 | 14.73 | 17.63 | 23.83 |

It can be observed from the above highlighted experimental data that the value Std, the difference in thickness between the deposited layer of silicon nitride in the perimeter of the substrate and the center of the substrate, is smaller using the ramp-down method of deposition for every substrate #1 through #7 that was part of the experimental verification.

From this it may be concluded that the invention, by not maintaining the process temperature at one constant value for the full duration of the CVD based creation of a layer of semiconductor material and by ramping-down the temperature of the substrate at a selected point during the CVD based creation of a layer of semiconductor material, has improved the uniformity of the deposition of the layer of semiconductor material.

This is further confirmed by the curves that are shown in FIG. 5a. Curve a, FIG. 5a, shows the measured Deposition Uniformity (plotted along the vertical or Y-axis) of deposition of a layer of 1,625 Angstrom of silicon nitride for three different zones U (upper zone), C (center zone) and L (lower zone) within a CVD deposition furnace. The zones of the CVD furnace are plotted along the horizontal or X-axis. The two curves represent both the conventional or standard method of creating the layer of silicon nitride (curve a) and the method of the invention (curve "b"). Curve "b" (representing the CVD method of the invention) is located below curve "a" (representing the conventional method of CVD deposition) for all of the zones U, C and L of the CVD chamber. Lower values of the difference in deposition uniformity (plotted along the Y-axis) represent improved deposition uniformity over the surface of the substrate for each of the zones (plotted along the X-axis) of the CVD furnace. The uniformity of deposition has been increased for each of these zones.

This latter finding is further confirmed by the numerical values of the parameter U (uniformity of deposition) that are shown in FIG. 5b for the three surface areas U, C and L.

It must further be pointed out that the invention is not limited to a linear reduction in processing temperature or that only one instance of temperature variation may be applied. The total processing time that is required for the completion of a LPCVD process can be sub-divided into multiple time interval. During each of these time intervals the applied temperature may be varied, a variation that may follow a linear variation of temperature versus time or a time variation that may follow a geometric dependency between temperature and processing time.

The invention, of performing a process of Low Pressure Chemical Vapor Deposition (LPCVD), can therefore be summarized as follows:

providing at least one substrate providing a Low Pressure Chemical Vapor Deposition (LPCVD) processing chamber preparing the Low Pressure Chemical Vapor Deposition (LPCVD) chamber for processing the at least one substrate by establishing operational processing conditions for the LPCVD processing chamber, the operational processing conditions comprising a first processing temperature in addition to other processing conditions, the operational processing conditions further comprising a processing time, the operational processing conditions further comprising a total processing time being the time that is required for completion of LPCVD processing of the at least one substrate positioning the at least one substrate inside the LPCVD processing chamber first LPCVD processing the at least one substrate during a first sub-period of the total processing time, thereby maintaining the other operational processing conditions of the LPCVD processing chamber, thereby specifically maintaining the first processing temperature second LPCVD processing the at least one substrate as a continuation of the first LPCVD processing over a second sub-period of the total processing time, thereby maintaining the other operational processing conditions of the LPCVD processing chamber while reducing the first processing temperature, the second sub-period of the total processing time increased by the first sub-period of the total processing time being equal to the total processing time terminating the LPCVD processing of the at least on wafer at termination of the second sub-period of the total processing time by discontinuing the other processing conditions for the LPCVD processing chamber, and removing the at least one substrate from the LPCVD processing chamber.

The invention, of performing a process of low Pressure Chemical Vapor Deposition (LPCVD), can alternately be summarized as follows:

providing at least one substrate providing a Low Pressure Chemical Vapor Deposition (LPCVD) processing chamber preparing the Low Pressure Chemical Vapor Deposition (LPCVD) chamber for processing the at least one substrate by establishing operational processing conditions for the LPCVD processing chamber, the operational processing conditions comprising a multiplicity of processing temperatures in addition to other processing conditions, the other processing conditions being valid during a total processing time being the time that is required for completion of LPCVD processing of the at least one substrate, the total processing time comprising a multiplicity of processing time intervals which when added comprise the total processing time, processing time within the multiplicity of processing time intervals being recognized as within interval processing time, the multiplicity of processing temperatures being related to the within interval processing time by an interval equation for each of the multiplicity of processing time intervals positioning the at least one substrate inside the LPCVD processing chamber LPCVD processing the at least one substrate in accordance with the interval equation, thereby maintaining the other operational processing conditions of the LPCVD processing chamber terminating the LPCVD processing of the at least on wafer at termination of the total processing time by terminating the other operational processing conditions for the LPCVD processing chamber, and removing the at least one substrate from the LPCVD processing chamber.

Although the invention has been described and illustrated with reference to specific illustrative embodiments thereof, it is not intended that the invention be limited to those illustrative embodiments. Those skilled in the art will recognize that variations and modifications can be made without departing from the spirit of the invention. It is therefore intended to include within the invention all such variations and modifications which fall within the scope of the appended claims and equivalents thereof.

What is claimed is:

1. A method of performing a process of Low Pressure Chemical Vapor Deposition (LPCVD), comprising the steps of:

providing at least one substrate;

providing a Low Pressure Chemical Vapor Deposition (LPCVD) processing chamber;

positioning said at least one substrate inside said LPCVD processing chamber;

first LPCVD processing said at least one substrate during a first sub-period of a total processing time, thereby depositing a first film over said at least one substrate, thereby specifically maintaining said first processing temperature;

second LPCVD processing said at least one substrate as a continuation of said first LPCVD processing over a second sub-period of said total processing time, thereby depositing a second film over said first film while reducing said first processing temperature;

terminating said LPCVD processing of said at least on wafer; and removing said at least one substrate from said LPCVD processing chamber.

2. The method of claim 1, said reducing said first processing temperature over a second sub-period of said total processing time comprising a linear function of said first processing temperature versus processing time.

3. The method of claim 1, said reducing said first processing temperature over a second sub-period of said total processing time comprising a geometric function of said first processing temperature versus processing time.

4. The method of claim 1, said providing a Low Pressure Chemical Vapor Deposition (LPCVD) processing chamber comprising preparing said Low Pressure Chemical Vapor Deposition (LPCVD) chamber for processing said at least one substrate by establishing operational processing conditions for said LPCVD processing chamber, said operational processing conditions comprising a first processing temperature in addition to other processing conditions, said operational processing conditions further comprising a processing time, said operational processing conditions further comprising a total processing time being the time that is required for completion of LPCVD processing of said at least one substrate.

5. The method of claim 1, said second sub-period of said total processing time being increased by said first sub-period of said total processing time being equal to said total processing time.

6. A method of performing a process of Low Pressure Chemical Vapor Deposition (LPCVD), comprising the steps of:

providing at least one substrate;

providing a Low Pressure Chemical Vapor Deposition (LPCVD) processing chamber;

preparing said Low Pressure Chemical Vapor Deposition (LPCVD) chamber for processing said at least one substrate by establishing operational processing conditions for said LPCVD processing chamber, said operational processing conditions comprising a multiplicity of processing temperatures in addition to other processing conditions, said other processing conditions being valid during a total processing time being the time that is required for completion of LPCVD processing of said at least one substrate, said total processing time comprising a multiplicity of processing time intervals which when added comprise said total processing time, processing time within said multiplicity of processing time intervals being recognized as within interval processing time, said multiplicity of processing temperatures being related to said within interval processing time by an interval equation for each of said multiplicity of processing time intervals;

positioning said at least one substrate inside said LPCVD processing chamber;

LPCVD processing said at least one substrate in accordance with said interval equation, thereby maintaining said other operational processing conditions of said LPCVD processing chamber;

terminating said LPCVD processing of said at least on wafer at termination of said total processing time by terminating said other operational processing conditions for said LPCVD processing chamber; and removing said at least one substrate from said LPCVD processing chamber.

7. The method of claim 6, said interval equation comprising linear functions.

8. The method of claim 6, said interval equation comprising geometric functions.

9. The method of claim 6, said interval equation comprising functions selected from the group of functions consisting of linear functions and geometric functions and combinations thereof.

* * * * *